(12) United States Patent
Mathijssen et al.

(10) Patent No.: US 12,189,305 B2
(45) Date of Patent: Jan. 7, 2025

(54) METROLOGY METHOD AND APPARATUS AND COMPUTER PROGRAM

(71) Applicant: ASML Netherlands B.V., Veldhoven (NL)

(72) Inventors: Simon Gijsbert Josephus Mathijssen, Rosmalen (NL); Patricius Aloysius Jacobus Tinnemans, Hapert (NL); Arie Jeffrey Den Boef, Waalre (NL); Kaustuve Bhattacharyya, Veldhoven (NL); Samee Ur Rehman, Milpitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 147 days.

(21) Appl. No.: 18/004,555

(22) PCT Filed: May 27, 2021

(86) PCT No.: PCT/EP2021/064156
§ 371 (c)(1),
(2) Date: Jan. 6, 2023

(87) PCT Pub. No.: WO2022/008135
PCT Pub. Date: Jan. 13, 2022

(65) Prior Publication Data
US 2024/0027918 A1 Jan. 25, 2024

Related U.S. Application Data

(60) Provisional application No. 63/049,897, filed on Jul. 9, 2020.

(51) Int. Cl.
*G03F 7/00* (2006.01)
*G03F 9/00* (2006.01)

(52) U.S. Cl.
CPC ........ *G03F 7/70633* (2013.01); *G03F 9/7042* (2013.01); *G03F 9/7046* (2013.01)

(58) Field of Classification Search
CPC ............. G03F 7/70616; G03F 7/70633; G03F 9/7042; G03F 9/7046
See application file for complete search history.

(56) References Cited

U.S. PATENT DOCUMENTS 9,535,255 B2 1/2017 Huang
9,910,366 B2 3/2018 Middlebrooks et al.
(Continued)

FOREIGN PATENT DOCUMENTS

EP 3 770 682 A1 1/2021
JP 2019-536096 A 12/2019
(Continued)

OTHER PUBLICATIONS

International Search Report and Written Opinion of the International Searching Authority directed to International Patent Application No. PCT/EP2021/064156, mailed Oct. 18, 2021; 11 pages.
(Continued)

*Primary Examiner* — Peter B Kim
(74) *Attorney, Agent, or Firm* — Sterne, Kessler, Goldstein & Fox P.L.L.C.

(57) ABSTRACT

Disclosed is a method of improving a measurement of a parameter of interest. The method comprises obtaining metrology data comprising a plurality of measured values of the parameter of interest, relating to one or more targets on a substrate, each measured value relating to a different measurement combination of a target of said one or more targets and a measurement condition used to measure that target and asymmetry metric data relating to asymmetry for said one or more targets. A respective relationship is determined for each of said measurement combinations relating
(Continued)

a true value for the parameter of interest to the asymmetry metric data, based on an assumption that there is a common true value for the parameter of interest over said measurement combinations. These relationships are used to improve a measurement of the parameter of interest.

14 Claims, 5 Drawing Sheets

(56) References Cited

U.S. PATENT DOCUMENTS

| | | | |
|---|---|---|---|
| 10,613,446 B2 | 4/2020 | Straaijer et al. | |
| 10,635,004 B2 | 4/2020 | Jiang et al. | |
| 10,656,533 B2 | 5/2020 | Mathijssen et al. | |
| 2011/0027704 A1 | 2/2011 | Cramer et al. | |
| 2011/0043791 A1 | 2/2011 | Smilde et al. | |
| 2012/0242940 A1 | 9/2012 | Nagata et al. | |
| 2015/0316490 A1 | 11/2015 | Amit et al. | |
| 2017/0263508 A1* | 9/2017 | Sho | G03F 7/70633 |
| 2019/0079413 A1 | 3/2019 | Mathijssen et al. | |
| 2019/0079414 A1 | 3/2019 | Straaijer | |
| 2019/0146356 A1* | 5/2019 | Pandey | G03F 7/70633 355/67 |

FOREIGN PATENT DOCUMENTS

| | | | |
|---|---|---|---|
| JP | 2020-518848 A | 6/2020 | |
| TW | 2015-06554 A | 2/2015 | |
| TW | 2015-18773 A | 5/2015 | |
| TW | 2019-21148 A | 6/2019 | |
| TW | 2019-21152 A | 6/2019 | |
| WO | WO 2009/078708 A1 | 6/2009 | |
| WO | WO 2009/106279 A1 | 9/2009 | |
| WO | WO 2011/012624 A1 | 2/2011 | |
| WO | WO 2015/018625 A1 | 2/2015 | |
| WO | WO 2018/202388 | 11/2018 | |

OTHER PUBLICATIONS

International Preliminary Report on Patentability directed to International Patent Application No. PCT/EP2021/064156, issued Jan. 10, 2023; 8 pages.

* cited by examiner

METROLOGY METHOD AND APPARATUS AND COMPUTER PROGRAM

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242940A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. The intensity asymmetry, a comparison of these diffraction order intensities, for a given target provides a measurement of target asymmetry, that is asymmetry in the target. This asymmetry in the target can be used as an indicator of overlay (undesired misalignment of two layers).

Although the known dark-field image-based overlay measurements are fast and computationally very simple (once calibrated), they may rely on an assumption that layer misalignment (i.e., overlay error and/or deliberate bias) is the only cause of measured intensity asymmetry. Any other contributions to measured intensity asymmetry, such as any process effect within one or both of the overlaid gratings, also causes a contribution to intensity asymmetry in the $1^{st}$ (and other higher) orders. This intensity asymmetry contribution attributable to process effect, and which is not related to overlay, clearly perturbs the overlay measurement, giving an inaccurate overlay measurement. A similar issue occurs with alignment measurements due to asymmetries in the alignment targets or marks measured. Asymmetry in the lowermost or bottom grating of a target is a common form of process effect. It may originate for example in wafer processing steps such as chemical-mechanical polishing (CMP), performed after the bottom grating was originally formed.

It is therefore desirable to improve the accuracy of overlay and/or alignment measurements.

SUMMARY OF THE INVENTION

The invention in a first aspect provides a method of improving a measurement of a parameter of interest, comprising: obtaining metrology data comprising a plurality of measured values of the parameter of interest, relating to one or more targets on a substrate, each measured value relating to a different measurement combination of a target of said one or more targets and a measurement condition used to measure that target; obtaining asymmetry metric data relating to asymmetry for said one or more targets; determining a respective relationship for each of said measurement combination relating a true value for the parameter of interest to the asymmetry metric data, based on an assumption that there is a common true value for the parameter of interest over said measurement combinations; and using one or more of said relationships to improve a measurement of the parameter of interest.

The invention further provides a computer program comprising processor readable instructions which, when run on suitable processor controlled apparatus, cause the processor controlled apparatus to perform the method of the first aspect and a computer program carrier comprising such a computer program. The processor controlled apparatus may comprise a metrology apparatus or lithographic apparatus or processor therefor.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIG. 3 comprises (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures;

DETAILED DESCRIPTION OF EXEMPLARY EMBODIMENTS

Before describing embodiments of the invention in detail, it is instructive to present an example environment in which embodiments of the present invention may be implemented.

Figure 1:
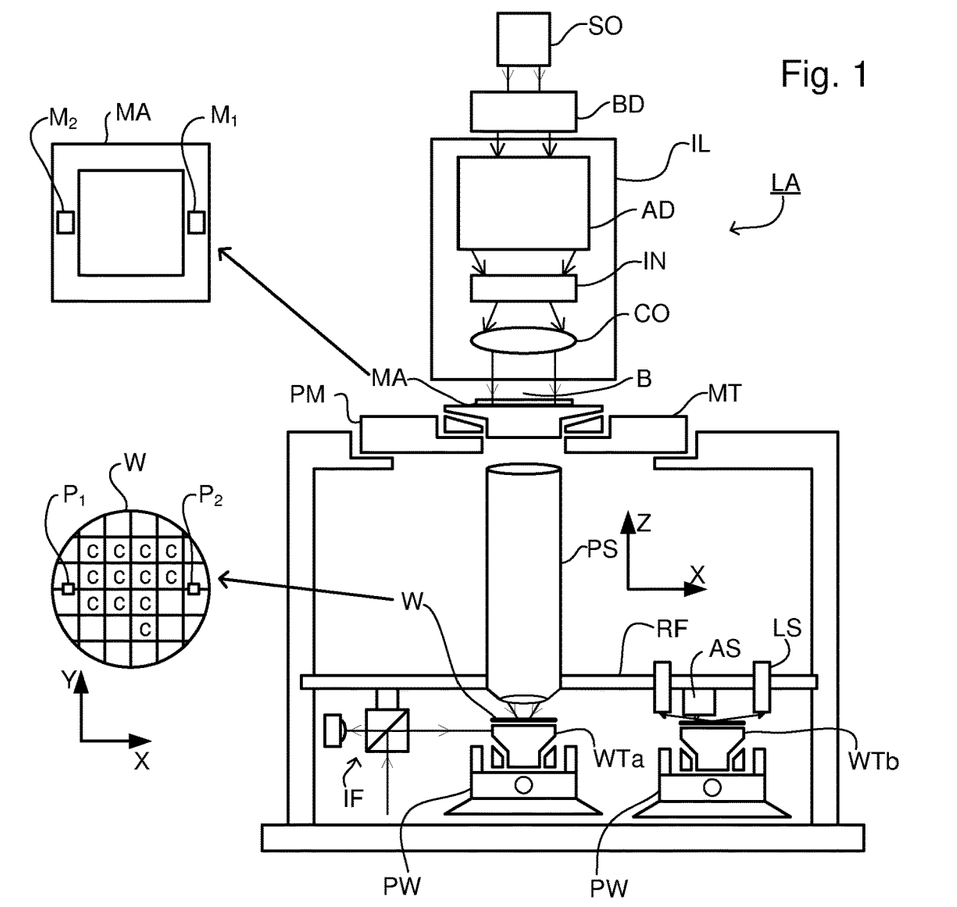
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
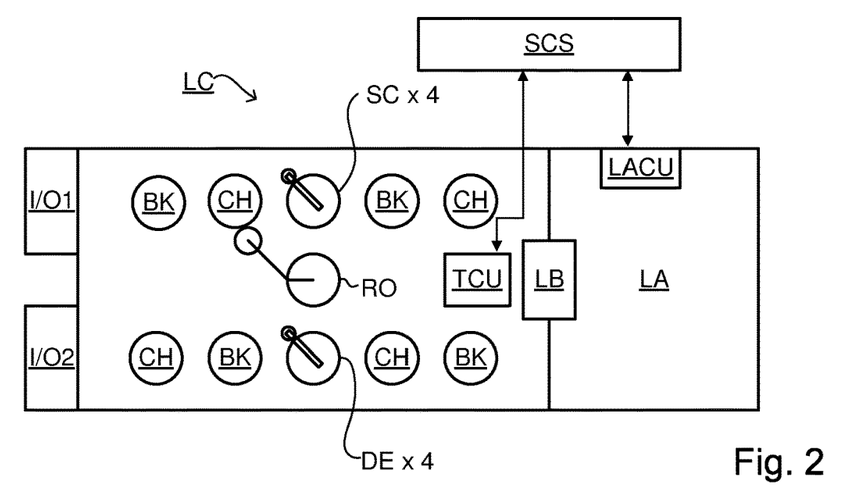
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus suitable for use in embodiments of the invention is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures, such as those which enable simultaneous illumination and detection from two opposing directions in combination with optical wedges to separate the resultant images. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line+1 and double dot-chain line−1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 3:
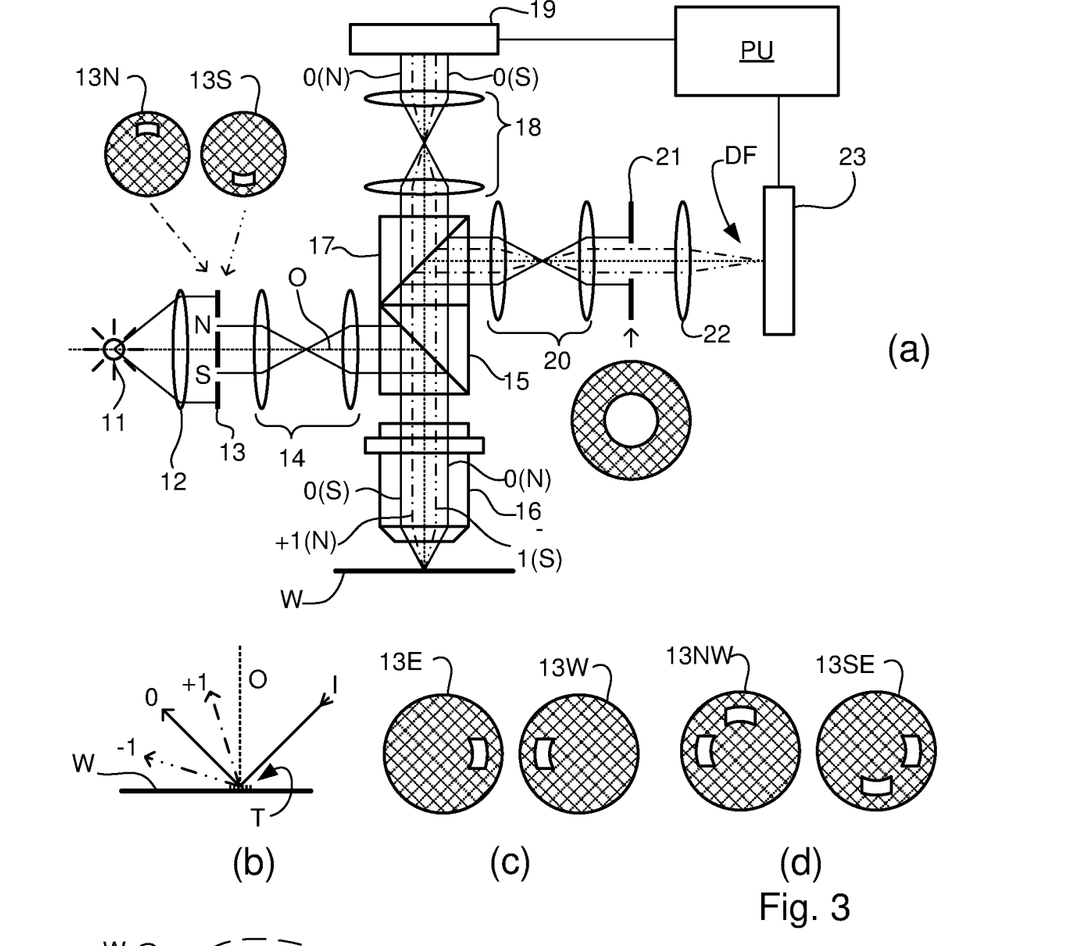

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

Figure 4:
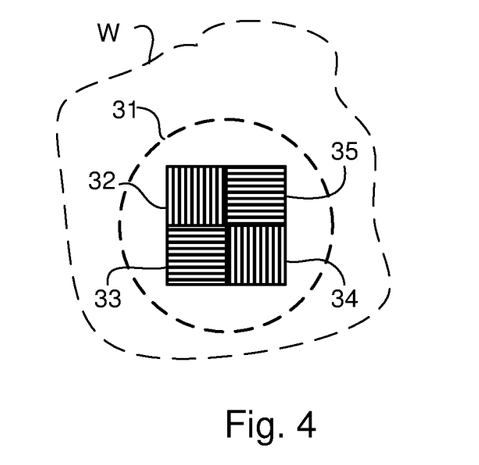
FIG. 4 depicts a known form of multiple grating target and an outline of a measurement spot on a substrate.

FIG. 4 depicts a (composite) target formed on a substrate according to known practice. The target in this example comprises four gratings 32 to 35 positioned closely together so that they will all be within a measurement spot 31 formed by the metrology radiation illumination beam of the metrology apparatus. The four gratings thus are all simultaneously illuminated and simultaneously imaged on sensors 19 and 23. In an example dedicated to measurement of overlay, gratings 32 to 35 are themselves composite gratings formed by overlying sub-gratings that are patterned in different layers of the semi-conductor device formed on substrate W. Gratings 32 to 35 may have differently biased overlay offsets in order to facilitate measurement of overlay between the layers in which the different parts of the composite gratings are formed. The meaning of overlay bias will be explained below with reference to FIG. 7. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23. This is only one example of a target. A target may comprise more or fewer than 4 gratings, or only a single grating.

Figure 5:
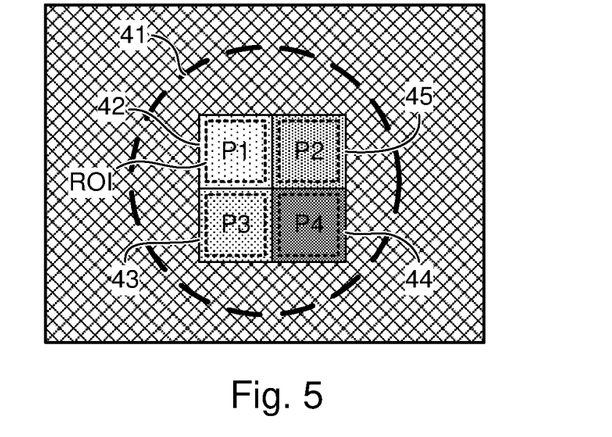
FIG. 5 depicts an image of the target of FIG. 4 obtained in the scatterometer of FIG. 3.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
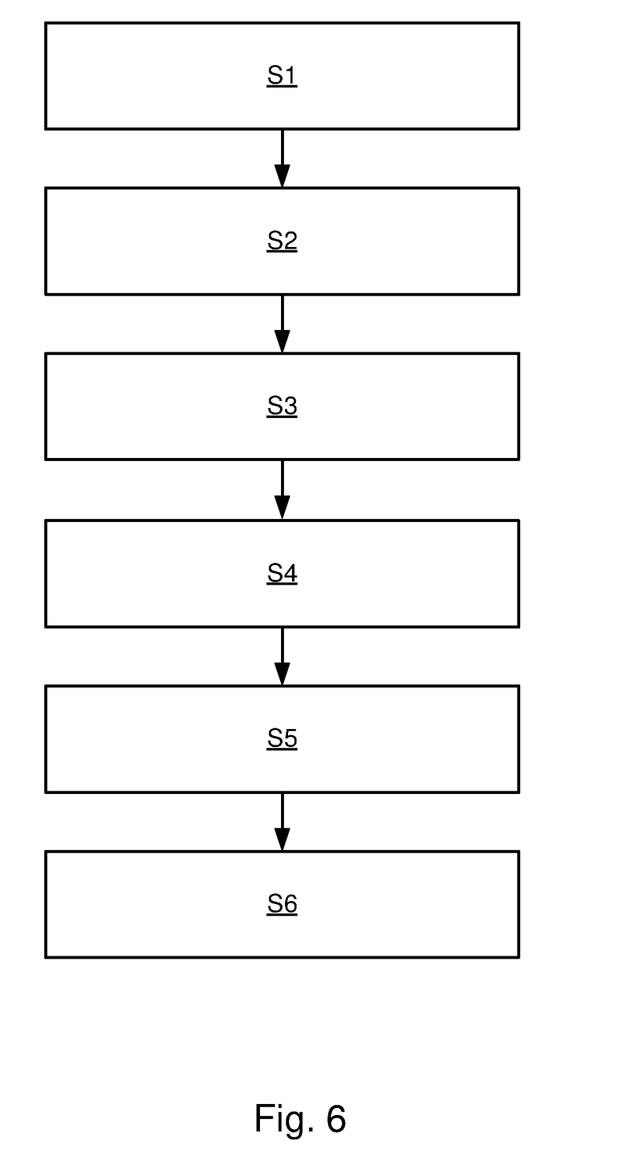
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay (i.e., undesired and unintentional overlay misalignment) between the two layers containing the component gratings 32 to 35 is measured. This measurement is done through target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create a target including the gratings 32-35. At S2, using the metrology apparatus of FIG. 3, an image of the gratings 32 to 35 is obtained using only one of the first order diffracted beams (say −1). At step S3, whether by changing the illumination mode, or changing the imaging mode, or by rotating substrate W by 180° in the field of view of the metrology apparatus, a second image of the gratings using the other first order diffracted beam (+1) can be obtained. Consequently the +1 diffracted radiation is captured in the second image. Note, as mentioned above, these first and second images may be obtained simultaneously from simultaneous illumination in two opposite directions.

Note that, by including only half of the first order diffracted radiation in each image, the 'images' referred to here are not conventional dark field microscopy images. The individual target lines of the targets will not be resolved. Each target will be represented simply by an area of a certain intensity level. In step S4, a region of interest (ROI) is identified within the image of each component target, from which intensity levels will be measured.

Having identified the ROI for each individual target and measured its intensity, the asymmetry of the target, and hence overlay, can then be determined. This is done (e.g., by the processor PU) in step S5 comparing the intensity values obtained for +1 and −1 orders for each target 32-35 to identify their intensity asymmetry, e.g., any difference in their intensity. The term "difference" is not intended to refer only to subtraction. Differences may be calculated in ratio form. In step S6 the measured intensity asymmetries for a number of targets are used, together with knowledge of any known imposed overlay biases of those targets, to calculate one or more performance parameters of the lithographic process in the vicinity of the target T. In the applications described herein, measurements using two or more different measurement conditions or "recipes" will be included. A performance parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be described.

It is known that process effects such as bottom grating asymmetry or other unwanted asymmetries in the target affect overlay measurements based on an assumption that overlay is dependent on intensity asymmetry. Structural asymmetry in the bottom grating of a target is a common form of process effect. It may originate, for example, in the substrate processing steps such as chemical-mechanical polishing (CMP), performed after the first structure was originally formed. However, it is to be understood that this is only a single example of process effect. As a result of these process effects, the overall target asymmetry of a target will comprise an overlay contribution due to the process effect in addition to the target overlay (and any intentional bias).

When overlay is measured by the method of FIG. 6 using only two biased gratings and single illumination condition (e.g., wavelength and/or polarization or combination thereof), the process effect cannot be distinguished from the overlay, and overlay measurements become unreliable as a result.

A plot between overlay OV and intensity asymmetry A for an 'ideal' target having zero offset and no process effect intensity asymmetry A has a non-linear periodic relationship (e.g., sinusoidal relationship) with the overlay. The period P of the sinusoidal variation corresponds to the period or pitch P of the gratings, converted of course to an appropriate scale. The sinusoidal form is pure in this example, but can include harmonics in real circumstances.

As mentioned above, biased gratings (having a known imposed overlay bias) can be used to measure overlay, rather than relying on a single measurement. This bias has a known value defined in the patterning device (e.g. a reticle) from which it was made, that serves as an on-wafer calibration of the overlay corresponding to the measured intensity asymmetry. In steps S1-S5, intensity asymmetry measurements $A^{+d}$ and $A^{-d}$ are obtained for gratings having imposed biases +d an −d respectively. Knowing the biases, the OV can be calculated.

A method for addressing the aforementioned process effect issue is described in WO2015018625A1 which is incorporated herein by reference. Represented graphically (although of course, the method may be performed algorithmically), this method essentially describes calculating overlay by measuring a composite target under more than one measurement condition and plotting these measurements on a graph in asymmetry space. In this context, asymmetry space comprises a plot of an intensity asymmetry measurement from the positively biased (+d) target ($A^{+d}$ measurement) against an intensity asymmetry measurement from the negatively biased (−d) target ($A^{-d}$ measurement) for each measurement condition. A regression is fitted through each point on the asymmetry space plot (but not necessarily the origin), and overlay is estimated from the slope of the regression (e.g., in a linear fitting). The method described in WO2015018625A1 relies on the assumption that the relationship between the $A^{+d}$ measurements and $A^{-d}$ measurements are substantially linear. However, the concepts described herein are not limited to methods which use linear models, and non-linear extended models may be used and compared instead.

For a perfect target, this plot would go through the origin, and previous methods assumed this to be the case; e.g., in such methods a single wavelength measurement is plotted as a single point and the regression plotted through this point and the origin, with overlay determined from the slope of this line. WO2015018625A1 taught that a better estimate for overlay may be achieved by not including the origin in the regression, with the offset of the regression from the origin (referred to herein as distance-to-origin or DTO value) being indicative of the process effect. Such a method may be based on an assumption that the points relating each of the two or more measurement conditions will yield measurement values which, when plotted in asymmetry space, lie substantially on a regression indicative of overlay (i.e., all lie substantially on the same line having a slope representative of overlay). DTO may be used as an additional metric or process asymmetry metric, and may comprise, for each set of data, the shortest distance from the plot origin to the line, i.e. at 90° to the line of best fit through the points on the graph to the plot origin. The DTO is a useful indicator of the feature or process asymmetry of the target and is approximately independent of the actual overlay.

Figure 7:
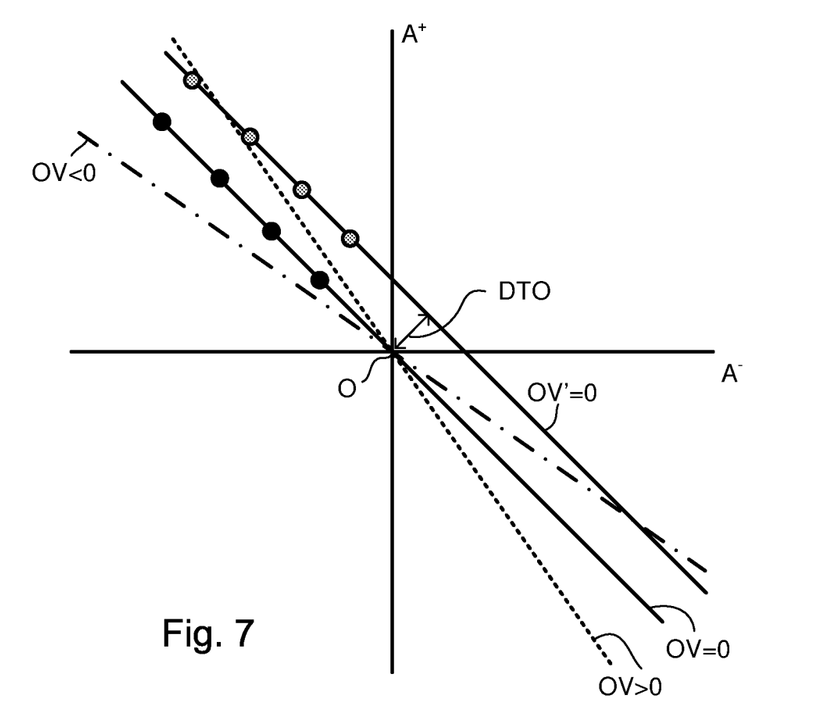
FIG. 7 is a plot in asymmetry space describing the principle of determining overlay and an asymmetry metric from multiple wavelength measurement data from targets having two biases.

FIG. 7 illustrates the concept as is presently understood. The plotted solid line OV=0 through the origin O and the black measurement points are representative of a perfect target without process effect or any overlay or bias. The dotted line OV>0 is a regression for a perfect target other than having overlay or bias in a first direction and the dot-dash line OV<0 is a regression for a perfect target other than having overlay or bias in a second direction (the measurement points are not shown for these). The solid line OV'=0 regressed through the gray measurement points is representative of an imperfect target (e.g., with process asymmetry), but without any overlay or bias; i.e., it is the imperfect version of the line OV=0. As the slope of the lines OV=0 and OV'=0 are the same, the method of WO2015018625A1 was understood to enable determination of overlay from imperfect targets separately from other asymmetries and process effects. The DTO metric is an indicative metric of these other asymmetries and process effects.

Methods such as described in WO2015018625A1, describe using measurements at several or more measurement conditions or wavelengths/polarizations to determine a robust regression and therefore overlay. With a linear regression, it should be that only two measurements are required; in reality, points in asymmetry space relating to some measurement conditions may deviate significantly from the overlay line and/or the $A^{+d}/A^{-d}$ regression may be substantially non-linear for a particular set of measurement conditions or target. However, when monitoring overlay during device manufacture, it would be prohibitively slow to measure a full range of 10, 20 or more measurements, each relating to a different measurement condition, so as to ensure a good fit and therefore reliable overlay value. As such, a small subset (e.g., of two or three measurement conditions) are typically chosen for production monitoring, wherein a subset of measurement conditions may be referred to as a measurement recipe. However, the quality of measurement varies for different subsets of these measurement conditions for a target, and the optimal subset varies from target-to-target. As such, careful selection of the subset of measurement conditions or measurement recipe used for production monitoring is important on a per-stack or per-target basis. Such a selection may use as a reference, a regression from a more comprehensive set of measurements performed for a particular target/stack in a calibration phase.

Present methods for optimizing measurement recipes for targets are performed for each target without the knowledge of other targets/recipes. There is presently no concept of combining information from different targets/recipes. For these present methods, the inventors have observed that single targets can demonstrate very good KPIs (indicating an optimized recipe for that target), but still measure the wrong overlay (or alignment) value. As such, it has been observed that different overlay measurements (e.g., from different targets, regions of the same target and/or relating to different illumination properties) within a common wafer region, and which therefore should measure the same overlay, in fact showed significant measurement-to-measurement variation. Furthermore, measurement values from different targets (or regions thereof) when measured using an optimized measurement recipe also show significant target-to-target variation. There are target asymmetry modes for which present multi-wavelength optimization methods are less accurate. Similar behavior has been observed across different stack types in alignment, where more than 1 nm target-to-target variation in measured alignment was found for targets physically close (e.g., <10 μm separation) to one another.

Figure 8:
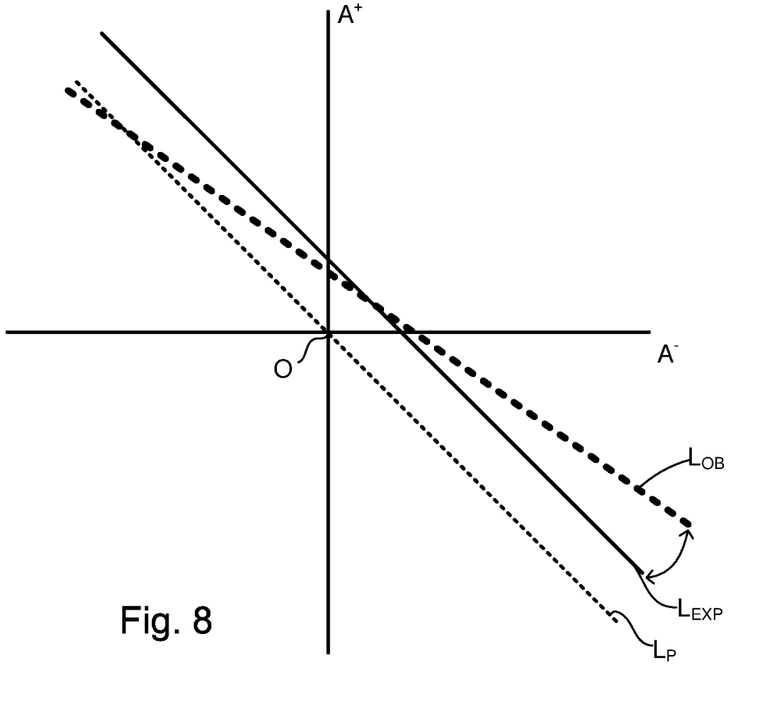
FIG. 8 is a plot in asymmetry space describing an issue with such measurements which can result in an error in the estimation of overlay.

FIG. 8 illustrates a possible root cause (in overlay) for this failure. It is proposed that a combination of a phase and amplitude asymmetry may be responsible. The thin dotted line $L_P$ represents a perfect target. The methods described above are based on the assumption that non-overlay target asymmetries cause only a shift in the regression, but no change in slope; this is represented by the solid expected regression $L_{EXP}$. What has been observed is that other asymmetry modes (e.g., a shift in the "center of gravity" of the target) results in a phase asymmetry and a rotation of the regression (e.g., as represented by the observed line $L_{OB}$). This rotation will result in a different, incorrect value for overlay (all three lines relate to a target with zero overlay).

Figure 9:
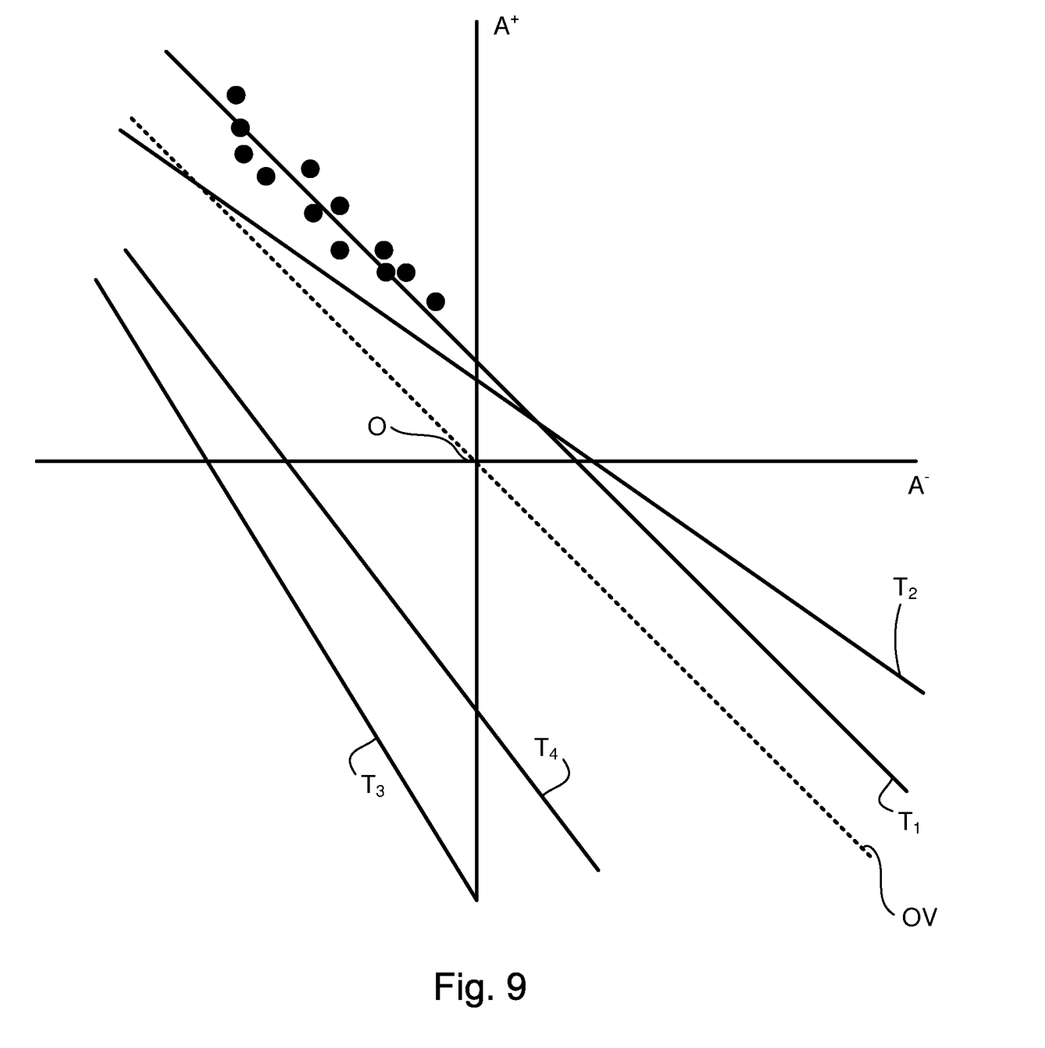
FIG. 9 is a plot in asymmetry space illustrating how this issue can result in different errors in the estimation of overlay for different targets.

It is further observed that this rotation and shift may be different for each target design. This is illustrated in FIG. 9, which shows four regressions $T_1$, $T_2$, $T_3$, $T_4$ for four targets having the same (zero) true overlay represented by the dotted line OV. As can be seen, the regression for each of these targets has a different slope and DTO.

To address these issues, a method for optimizing a measurement recipe and/or determining a correction over a plurality of measurement values from one or more targets is proposed such that measured parameter of interest (e.g., overlay or position) differences between the measurement values are minimized Each measurement value may relate to a different measurement combination of a target and a measurement condition used to measure that target. The combination may vary in terms of target, measurement condition or both to obtain each measurement. For example, there may be one measurement value per target. Alternatively, there may be more than one measurement value per target; e.g., measurement values obtained using different measurement recipes or measurement conditions per target so as to obtain a different sampling of the asymmetric content per target. The measurements may come from only one target (e.g., with more than one measurement recipe), or more than one target (e.g., with one or more measurement recipes per target). Different measurement values (e.g., per recipe) may also be obtained from different regions of the same target; e.g., the target is sub-divided into multiple sections or regions.

In this method, it is assumed that all measurement values should be the same and any variation is due to other asymmetries. Therefore it is assumed that the true value for the parameter of interest is common for all the measurement values. As such, the plurality of measurements should be obtained from targets (e.g., where the number of targets number more than one) which are all located in the same vicinity or a common wafer region. In this way, all the measurement values and all targets may be expected to have the same overlay. In multiple target embodiment, each target of the plurality of targets may differ from each other in an aspect other then expected overlay, such that their non-overlay asymmetries may be different.

The method is also applicable to alignment, for which any mention of overlay may be substituted for position. A specific alignment embodiment will be described later.

The concepts disclosed herein are based on the observation that, for a given measurement recipe or setting, the measured overlay of a target shows a significant linear dependence on a process asymmetry metric or non-overlay asymmetry metric relating to the target. Such a process asymmetry metric may be DTO as already described when a parameter of interest is overlay, for example. However any other process asymmetry metric may be used which quantifies a degree of non-overlay asymmetry in the target (or in an alignment setting, any target asymmetry(s)). As such, the method comprises finding a relationship (e.g., a proportionality constant for a linear example described below, although other functions describing more complex relationships are possible) relating the true overlay to the process asymmetry metric. As the true overlay is not known, the method is based on performing an optimization which minimizes recipe-to-recipe, target-to-target (when multiple targets are measured) and optionally polarization-to-polarization differences between measured overlay values from measurements expected to have the same true overlay (e.g., in the same vicinity on the wafer). In the same vicinity may be, for example separated by no more than 1.5 mm or 1 mm (e.g., having a separation distance between 10 μm and 1.5 mm).

As such, in an overlay example, it is proposed that all targets fulfill the relationship:

$$OV_{real} = OV_{meas\,n,P} + C_{n,P} * DTO_{n,P} \quad (1)$$

where $OV_{real}$ is the true overlay, $OV_{meas\,N,P}$ is the measured overlay, C is a constant and DTO is the distance-to-origin as has been described (or other non-overlay asymmetry metric). N and P refer to the target and polarization, such that all parameters except the real overlay are target and measurement condition dependent (e.g., where a different measurement condition may vary in terms of one or more of wavelength, bandwidth, polarization, angle of incidence). $OV_{real}$ is assumed to be constant for the measurement conditions being optimized (e.g. all within a particular region or distance from each other). However, there are multiple such regions on the wafer to build up the correlations defined by Equation (1). As already mentioned, a linear relationship such as described here is only one example, and the proposed methods may use other predictable relationships between overlay and a (non-overlay) asymmetry metric. Although there is only one non-overlay asymmetry metric is mentioned in Equation (1), it is appreciated that Equation (1) can be extended to include more than one non-overlay asymmetry metric.

The main assumption is that the variation of the real overlay $OV_{real}$ should be zero (provided that the targets are sufficiently close together); however there are multiple measured overlay values coming from different regions of the wafer. Therefore, an optimization is proposed which finds $C_{N,P}$ such that the variation of $OV_{real}$ is small (minimized). This can be realized by minimizing all individual OV value differences on a certain location (e.g. 3 targets, for two polarizations provide 15 such differences if all differences are used).

It may be noted that the prior art calibration regressions described above (e.g., using 20 wavelengths) may be performed per target and per polarization (e.g., of two polarization states). A similar treatment may be used for the methods disclosed herein, with a different dataset and optimization problem posed per measurement condition, in addition to per target.

More detail on the optimization and how it may be solved will now be described. Equation 1 may be restated into a generalized form, $$\underline{y}_n = \underline{x}_n + \underline{x}_n \cdot \underline{x}_n \quad (2)$$

where y is the true value for the parameter of interest, x is the measured value for the parameter of interest, c is the constant to be found and z is an asymmetry offset term which may be the DTO term in an overlay example; n∈{1, 2,3, . . . , N} and N is the total number of measurement conditions (e.g. target/polarization combinations). For example, N may be 6 for an example of two polarizations and three different marks or mark types.

All N equations can be combined into a single equation by concatenating all column vectors in the row direction, to yield:

$$\underline{Y} = \underline{X} + \underline{Z} \cdot \mathrm{diag}(\underline{c}) \quad (3)$$

The optimization problem may be posed (using the Frobenius norm) as:

$$\underline{c}_* = \mathrm{argmin}(\|\underline{Y} \cdot \underline{D}\|_F^2) \quad (4)$$

where the $\underline{D}$ matrix is used to compute all overlay differences (and optionally could also contain/provide a weighing of the estimation residuals). For the example N=6, matrix $\underline{D}$ will have six rows and 15 columns, a column for each of the possible differences (it is possible to compute for fewer than all possible differences in which case there would be fewer columns).

Expanding this optimization problem yields:

$$\underline{c}_* = \mathrm{argmin}(\|(\underline{X} + \underline{Z} \cdot \mathrm{diag}(\underline{c})) \cdot \underline{D}\|_F^2) \quad (5)$$

The gradient of the cost function with respect to the unknown $\underline{c}$ equals:

$$\frac{\partial \|(\underline{X} + \underline{Z} \cdot \mathrm{diag}(\underline{c})) \cdot \underline{D}\|_F^2}{\partial \underline{c}} = \frac{\partial \|(\underline{X} \cdot \underline{D} + \underline{Z} \cdot \mathrm{diag}(\underline{c})) \cdot \underline{D}\|_F^2}{\partial \underline{c}} \quad (6)$$

$$= \mathrm{diag}(2 \cdot \underline{Z}^T (\underline{X} \cdot \underline{D} + \underline{Z} \cdot \mathrm{diag}(c) \cdot \underline{D}) \cdot \underline{D}^T) \quad (7)$$

which uses the following identities:

$$\|\underline{X}\|_F^2 = \mathrm{trace}(\underline{X} \cdot \underline{X}^T)$$

$$\frac{\partial}{\partial \underline{X}} \mathrm{trace}((\underline{A} \cdot \underline{X} \cdot \underline{B} + \underline{C}) \cdot (\underline{A} \cdot \underline{X} \cdot \underline{B} + \underline{C})^T) = 2 \cdot \underline{A}^T \cdot (\underline{A} \cdot \underline{X} \cdot \underline{B} + \underline{C}) \cdot \underline{B}^T$$

Solving the optimization problem may be achieved by, for example, a steepest descent algorithm, using the determined gradient.

In one embodiment, the proposed calibration may be used to determine the target dependent proportionality constant C (or other relationship function). This can then be stored and subsequently used to correct measurements of a parameter of interest from a respective target type or measurement setting (e.g., in a production setting).

In another embodiment, the aforementioned methods may be used in a measurement recipe optimization for each target or target type. Such a method may perform the optimization and determine the proportionality constant/other relationship as described, but then using the result of the optimization to determine a preferred measurement recipe (e.g., one which minimizes target-to-target (and optionally polarization-to-polarization) variation in the measured parameter of interest). In such a method, it may be that the determined relationship is not actually used to correct measurements in a production setting (although this can still be done). The optimized measurement recipe for the target may be optimized such that the measured value is of a high accuracy in any case.

The method for optimizing a measurement recipe may comprise a method based on determining a preferred subset (e.g., fewer than six, such as three or two) wavelengths for each target or target type out of many more wavelengths (e.g., more than 10, more than 20 or more than 30). It should be appreciated that while measurement points of a single target using these many wavelengths will show a linear trend per target when plotted in asymmetry space, they will not all lie exactly on the same line. This means that a different slope is obtained (and therefore a different measured overlay is effectively estimated) for each regression through different measurement subsets (e.g., wavelength pairs). This is clear from FIG. 9, where the regression for target $T_1$ is shown through two measurement points relating to a particular wavelength pair. It is readily apparent that regressing through a different wavelength pair can yield a significantly different slope and a different linear dependence $C_{N,P}$ on its asymmetry indicator (e.g. DTO).

Because asymmetry indicators (like e.g. DTO) are typically measurement condition (e.g. wavelength, bandwidth, polarization, angle of incidence) dependent parameters, each measurement condition (e.g. subsets or pair of wavelengths) will have a different respective $C_{N,P}$. Similarly, asymmetry metrics in alignment are also measurement setting dependent and a unique weight should be learnt for each measurement setting. As such, the aforementioned optimization of Equation 1 may be performed in terms of optimizing the constant C for all combinations of candidate measurement settings (e.g. wavelength pairs/subsets and target or target/polarization combinations). Candidate measurement settings may comprise some or all possible combinations of e.g., two or three wavelengths out of the wavelengths used. The method may then comprise determining which wavelength pair/subset results in the smallest overlay (or other parameter of interest) variation over the targets/polarizations. A method for assessing this may comprise determining for which wavelength subset does the measured data match the expected model (e.g., as described by Equation (1)) and/or which wavelength subset best minimizes the parameter of interest difference between measurement values. This may comprise determining for which subset of wavelengths is the relationship between overlay variation and the asymmetry metric most linear (for the linear example described herein), most closely matches the model (if not linear) or best minimizes the parameter of interest difference between measurement values.

Although within the scope of the present disclosure, it is apparent that the number of combinations may be unwieldy or unfeasible to solve brute-force in an optimization (at least according to present processing speeds). By way of a specific example, if N=6 (e.g., 3 targets and 2 polarizations) and the number of measurement wavelengths is 33, then the total number of combinations to compute optimal wavelength pairs (i.e., the measuring subset is 2) for each of the target/polarization pairs will be $(33*32/2)^6$. This is of an order of magnitude of $10^{16}$ combinations.

Therefore, one method to address this may comprise restricting the number of combinations by fixing or constraining subsets of the N target/polarization pairs to have the same optimal wavelength pair. This may be done based on an evaluation of (e.g, based on the similarity of) their respective swing curve for example. A swing curve may comprise a plot of a measurement parameter against wavelength. Suitable measurement parameters for such a swing curve plot may comprise intensity, signal strength, stack sensitivity or overlay sensitivity for example. Such swing curves are known in the art, and may be used, for example, to optimize recipe selection for a target on an individual, per target basis.

By plotting one or more swing curves (e.g., two or more curves for respective different said measurement parameters may be plotted and compared for robustness) for each target/polarization pair, they may be compared to find combinations which display a similar response signature and for which it can be inferred or assumed that the optimized recipe will be the same, or at least sufficiently similar that a recipe optimized for one such target/polarization pair will show good performance for a target/polarization pair deemed similar. The similarity comparison may be evaluated according to any suitable similarity metric, or even by observation. The number of combinations grouped together may be predetermined to obtain a minimum reduction in combinations, may be based purely on their similarity, or a hybrid approach. The number of target/polarization pairs in a group may be limited, or not. By way of a specific example, if the six target/polarization pairs are grouped into three groups of similar target/polarization pairs, then the number of combinations becomes: $(33*32/2)^3$, which is of an order of magnitude of $10^8$. However, this is still a large number. The number of combinations may be further reduced by considering fewer wavelengths, but this is not ideal.

Other methods to make the optimization more wieldy may be to use combinatorial optimization techniques such as simulated annealing techniques and/or local search. Such methods are known in the art and will not be disclosed further.

A more practical approach may be based on an already used recipe set up and optimization flow referred to as holistic metrology qualification (HMQ). The method aims to find the optimum (single-/multi-wavelength) recipe based on subsequent sparse, then dense sampling of targets/locations at a plurality of illumination settings (wavelengths and other recipe settings, e.g. polarization, aperture). The details of the flow may vary, but in one example, HMQ may comprise performing a pre-selection step on a relatively low number of targets, using the full wavelength spectrum available (or large number of wavelengths). For example, the number of targets measured at this step may be fewer than 20, more specifically between 3 and 15. The number of wavelengths may be (for example) more than 30. The better performing subset of wavelengths (including e.g., between 10 and 20, or about 15 wavelengths) are selected for the optimizing step. The optimization step may comprise measuring a dense number of targets with the selected (e.g., about 15) wavelengths. For example, the number of targets may be more than 50, more than 70, more than 90 or about 100. The optimization comprises an evaluation, where the measurements under the different illumination conditions are evaluated for accuracy and robustness. This evaluation step may use a reference overlay value for the actual overlay value. As the actual overlay value is not typically known, previous methods for determining a reference include that described in patent application WO 2015/018625. The result of this method is an optimized measurement recipe.

It is proposed that the calibration disclosed herein is used to determine a multi-target reference to use as the reference overlay value. The main goal of the recipe optimization is to find the target-recipe-combination which is least affected by target asymmetry. By using a multi-target reference, the effects of target deformations are mitigated, and therefore the best matching dual wavelength recipe will also have a lowest impact on target deformation.

The method may comprise determining this multi-target reference on a setup wafer using the techniques already described; i.e., optimizing a relationship term to minimize differences of measurements of a plurality of measurement conditions on optionally multiple targets, and using the result of the optimization to calculate the true overlay. This will determine a true overlay value for each target. An HMQ flow or similar may then be performed, which evaluates each measurement wavelength subset (either in a two stage method as described in the preceding paragraph or otherwise) by performing measurements with each wavelength subset. The wavelength subset which provides a measured value for a target which is best matched to the actual overlay reference can then be selected as the optimized measurement recipe for that target. This can be repeated for all targets. The performance of the selected measurement recipe during production may be monitored using standard indicators such as DTO, stack sensitivity etc. An additional advantage therefore, is the entire existing flow is unchanged other than the determination of the overlay reference.

While the abovementioned description has described the concepts in terms of overlay, it should be appreciated that the concepts are also applicable to alignment. In such an embodiment, the same basic assumption that there is only one true alignment position $AL_{real}$ for all measurement values of one or multiple targets (alignment marks) within the same vicinity. There are also asymmetry metrics $Asym_{n,P}$ for alignment which may be used in place of DTO determinations. Such asymmetry metrics may comprise, for example a color-to-color asymmetry metric, an intensity difference metric (difference of two complementary diffraction orders), a (bottom grating) asymmetry measurement performed using another apparatus such as a scatterometer as may be used for overlay measurement, a mark deformation estimate from an external algorithm (e.g., Kramers Kronig type inference schemes), or a derived estimate such as derivative of diffraction order intensity difference or ratio w.r.t wavelength. In such an example, Equation (1) becomes:

$$AL_{real} = AL_{meas\ n,P} + C_{n,P} * Asym_{n,P} \quad (8)$$

where $AL_{meas\ n,P}$ are the measured alignment values.

In the above, only a single asymmetry observable is described, but a plurality of asymmetry observables per mark may also be deployed (e.g. the intensity difference or ratio between diffraction orders and/or its derivative with respect to wavelength) with the weight being learnt uniquely per asymmetry observable type. The optimization to determine $C_{n,P}$ can be performed on a setup or calibration wafer. The objective function for estimating the weights may incorporate various regularization techniques motivated by prior information, for example, a physical equation motivated Tikhonov regularization. Similarly, the choice of which wavelength combination to use and the number of wavelengths to employ may also be motivated by prior knowledge and/or measurement uncertainty/noise/bias. The use of multiple asymmetry metrics and/or regularizations are also applicable to the overlay embodiments (and other parameters of interest) described.

The determined $C_{n,P}$ (for a respective mark type) can be used to correct measured alignment during production. An advantage of optimizing using multiple targets is that the wafer deformation term is not present and that significantly different $C_{n,P}$ values can be generated, which provides a good separation sensitivity. In addition, or alternatively, the optimization may be used to calculate a true alignment reference, which can be used to evaluate alignment measurement recipes (wavelength subsets) analogously to the overlay embodiment described.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the methods disclosed herein.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Further embodiments according to the invention are described in below numbered clauses:

1. A method of improving a measurement of a parameter of interest, comprising: obtaining metrology data comprising a plurality of measured values of the parameter of interest, relating to one or more targets on a substrate, each measured value relating to a different measurement combination of a target of said one or more targets and a measurement condition used to measure that target;

obtaining asymmetry metric data relating to asymmetry for said one or more targets;

determining a respective relationship for each of said measurement combinations relating a true value for the parameter of interest to the asymmetry metric data, based on an assumption that there is a common true value for the parameter of interest over said measurement combinations; and using one or more of said relationships to improve a measurement of the parameter of interest.

2. A method according to clause 1, wherein said relationships are linear, and are described by a proportionality constant.

3. A method according to clause 1 or 2, wherein said one or more targets comprise a plurality of targets and/or target sections of one or more targets which are all located within 1.5 mm of each other.

4. A method according to any preceding clause, wherein the metrology data comprises, for each of said one or more targets, two or more measured values for the parameter of interest, each measured value per target relating to a different measurement condition.

5. A method according to clause 4, wherein said different measurement condition relates to a different polarization condition of the measurement radiation used to obtain the measured value.
6. A method according to any preceding clause, comprising performing an optimization which determines said relationship for each measurement combination so as to minimize differences in said measured values for the parameter of interest over said measurement combinations.
7. A method according to any preceding clause, wherein using said one or more of said relationships to improve a measurement of the parameter of interest comprises using said relationship to correct a subsequent measurement of the parameter of interest from a corresponding target and/or relating to a corresponding measurement combination.
8. A method according to any preceding clause, wherein using said one or more of said relationships to improve a measurement of the parameter of interest comprises using said relationship to determine a measurement recipe for measurement illumination used in a subsequent measurement of the parameter of interest from a corresponding target and/or relating to a corresponding measurement combination.
9. A method according to clause 8, wherein determining a measurement recipe comprises performing a calibration to determine a preferred subset of measurement wavelengths for each target and/or measurement combination from a plurality of wavelengths.
10. A method according to clause 9, wherein the subset of measurement wavelengths numbers two or three wavelengths.
11. A method according to clause 9 or 10, wherein said method comprises:
identifying candidate subsets of wavelengths out of said plurality of wavelengths;
performing an optimization which determines said relationships for each measurement combination and candidate subset of wavelengths, so as to minimize differences in said measured values for the parameter of interest over said measurement combinations and candidate subsets; and
determining which wavelength subset results in the smallest variation in the parameter of interest over the measurement combinations and/or for which wavelength subset does the measurement data best match an expected model.
12. A method according to clause 11, comprising restricting the number of measurement combinations optimized by fixing or constraining one or more subsets of said targets to have the same preferred subset of measurement wavelengths based on a similarity of respective response profiles for the targets.
13. A method according to clause 9 or 10, comprising using one or more of said relationships to determine a reference value representing the true value of said parameter of interest; and
evaluating candidate subsets of wavelengths out of said plurality of wavelengths by comparing measured values of said parameter of interest for a target using each candidate subset to said reference value.
14. A method according to clause 13, comprising, for each measurement combination or target, selecting as the preferred subset, the candidate subset of wavelengths for which said measured values of said parameter of interest is best matched to said reference value.
15. A method according to any preceding clause, wherein the parameter of interest is overlay.
16. A method according to any of clauses 1 to 14, wherein the parameter of interest is an aligned position.
17. A computer program comprising program instructions operable to perform the method of any preceding clause, when run on a suitable apparatus.
18. A non-transient computer program carrier comprising the computer program of clause 17.
19. A processing arrangement comprising:
the non-transient computer program carrier of clause 18; and a processor operable to run the computer program comprised on said non-transient computer program carrier.
20. A lithographic apparatus comprising:
an alignment sensor;
a patterning device support for supporting a patterning device;
a substrate support for supporting a substrate; and
the processing arrangement of clause 19.
21. A metrology apparatus comprising:
a support for a substrate;
an optical system for illuminating said structure with measurement radiation;
a detector for detecting the measurement radiation scattered by the structure; and
the processing arrangement of clause 19.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of improving a measurement of a parameter of interest comprising:
   obtaining metrology data comprising a plurality of measured values of the parameter of interest, relating to one or more targets on a substrate, each measured value relating to a different measurement combination of a target of the one or more targets and a measurement condition used to measure that target;
   obtaining asymmetry metric data relating to asymmetry for the one or more targets;
   determining a respective relationship for each of the measurement combinations relating a true value for the parameter of interest to the asymmetry metric data, based on an assumption that there is a common true value for the parameter of interest over the measurement combinations; and
   using one or more of the respective relationships to improve a measurement of the parameter of interest.

2. The method of claim 1, wherein the respective relationships are linear and are described by a proportionality constant.

3. The method of claim 1, wherein the one or more targets comprise a plurality of targets and/or target sections of one or more targets that are all located within 1.5 mm of each other.

4. The method of claim 1, wherein the metrology data comprises, for each of the one or more targets, two or more measured values for the parameter of interest, each measured value per target relating to a different measurement condition.

5. The method of claim 1, further comprising:
   performing an optimization that determines the relationship for each measurement combination so as to minimize differences in the measured values for the parameter of interest over the measurement combinations.

6. The method of claim 1, wherein the using the one or more of the respective relationships to improve a measurement of the parameter of interest comprises using the respective relationship to correct a subsequent measurement of the parameter of interest from a corresponding target and/or relating to a corresponding measurement combination.

7. The method of claim 1, wherein the using the one or more of the respective relationships to improve a measurement of the parameter of interest comprises using the respective relationship to determine a measurement recipe for measurement illumination used in a subsequent measurement of the parameter of interest from a corresponding target and/or relating to a corresponding measurement combination.

8. The method of claim 7, wherein the determining a measurement recipe comprises performing a calibration to determine a preferred subset of measurement wavelengths for each target and/or measurement combination from a plurality of wavelengths.

9. The method of claim 8, wherein the subset of measurement wavelengths numbers two or three wavelengths.

10. The method of claim 8, further comprising:
    identifying candidate subsets of wavelengths out of the plurality of wavelengths;
    performing an optimization that determines the respective relationships for each measurement combination and candidate subset of wavelengths, so as to minimize differences in the measured values for the parameter of interest over the measurement combinations and candidate subsets; and
    determining which candidate subsets of wavelengths results in the smallest variation in the parameter of interest over the measurement combinations and/or for which candidate subsets of wavelength does the measurement data best match an expected model.

11. The method of claim 8, further comprising:
    using one or more of the respective relationships to determine a reference value representing a true value of the parameter of interest; and
    evaluating candidate subsets of wavelengths out of the plurality of wavelengths by comparing measured values of the parameter of interest for a target using each candidate subset to the reference value.

12. A processing arrangement comprising:
    a non-transient computer program carrier comprising a computer program comprising program instructions operable to perform operations comprising improving a measurement of a parameter of interest comprising:
      obtaining metrology data comprising a plurality of measured values of the parameter of interest, relating to one or more targets on a substrate, each measured value relating to a different measurement combination of a target of the one or more targets and a measurement condition used to measure that target;
      obtaining asymmetry metric data relating to asymmetry for the one or more targets;
      determining a respective relationship for each of the measurement combinations relating a true value for the parameter of interest to the asymmetry metric data, based on an assumption that there is a common true value for the parameter of interest over the measurement combinations; and
      using one or more of the respective relationships to improve a measurement of the parameter of interest, when run on a suitable apparatus; and
    a processor operable to run the computer program stored on the non-transient computer program carrier.

13. A lithographic apparatus comprising:
    an alignment sensor;
    a patterning device support configured to support a patterning device;
    a substrate support configured to support a substrate; and
    a processing arrangement comprising a non-transient computer program carrier comprising a computer program comprising program instructions operable to perform a method of improving a measurement of a parameter of interest comprising:
      obtaining metrology data comprising a plurality of measured values of the parameter of interest, relating to one or more targets on a substrate, each measured value relating to a different measurement combination of a target of the one or more targets and a measurement condition used to measure that target;
      obtaining asymmetry metric data relating to asymmetry for the one or more targets;
      determining a respective relationship for each of the measurement combinations relating a true value for the parameter of interest to the asymmetry metric data, based on an assumption that there is a common true value for the parameter of interest over the measurement combinations; and using one or more of the relationships to improve a measurement of the parameter of interest, when run on a suitable apparatus; and a processor operable to run the computer program stored on the non-transient computer program carrier.

14. A metrology apparatus comprising:

a support configured to support a substrate;

an optical system configured to illuminate a structure with measurement radiation;

a detector configured to detect the measurement radiation scattered by the structure; and a non-transient computer program carrier comprising a computer program comprising program instructions operable to perform a method of improving a measurement of a parameter of interest, the method comprising:

obtaining metrology data comprising a plurality of measured values of the parameter of interest, relating to one or more targets on a substrate, each measured value relating to a different measurement combination of a target of the one or more targets and a measurement condition used to measure that target;

obtaining asymmetry metric data relating to asymmetry for the one or more targets;

determining a respective relationship for each of the measurement combinations relating a true value for the parameter of interest to the asymmetry metric data, based on an assumption that there is a common true value for the parameter of interest over the measurement combinations; and using one or more of the relationships to improve a measurement of the parameter of interest, when run on a suitable apparatus; and a processor operable to run the computer program stored on the non-transient computer program carrier.

* * * * *